United States Patent [19]

Bledsoe

[11] Patent Number: 4,700,175

[45] Date of Patent: Oct. 13, 1987

[54] DATA COMMUNICATION WITH MODIFIED HUFFMAN CODING

[75] Inventor: Robert E. Bledsoe, Miami, Fla.

[73] Assignee: Racal Data Communications Inc., Sunrise, Fla.

[21] Appl. No.: 922,499

[22] Filed: Oct. 23, 1986

Related U.S. Application Data

[62] Division of Ser. No. 711,325, Mar. 13, 1985, Pat. No. 4,646,061.

[51] Int. Cl.$^4$ .............................................. H03M 7/40
[52] U.S. Cl. ............................................ 340/347 DD
[58] Field of Search ................ 340/347 DD; 358/260, 358/261; 364/200, 900

[56] References Cited

U.S. PATENT DOCUMENTS 3,694,813  9/1972  Loh .............................. 340/347 DD
4,386,416  5/1983  Giltner et al. .

OTHER PUBLICATIONS

D. A. Huffman, "Method for the Construction of Minimum-Redundancy Codes", I.R.E., pp. 1098–1101; Sep. 1952.
F. Jelinek, "Buffer Overflow in Variable Length Coding of Fixed Rate Sources", IEEE Trans. Inform. Theory, vol. IT-14, pp. 490–501, 1968.
F. Jelinek and K. S. Schneider, "On Variable-Length-to-Block Coding", IEEE Trans. Inform. Theory, vol. IT-18(6), pp. 765–774, 1972.
*Data Compression*, Gilbert Held, John Wiley and Sons, 1983, pp. 60–71.

*Primary Examiner*—Charles D. Miller
*Attorney, Agent, or Firm*—Jerry A. Miller

[57] ABSTRACT

A method and apparatus for compression of data includes first encoding data characters according to a relative frequency of use table for each character to produce a frequency code. This frequency code is then compressed using a modified Huffman code. The code is modified by restricting the maximum word length to a predetermined number of bits. Different types of text can be encoded according to different frequency of use tables to maximize compression efficiency for various types of source data with minimum data processing.

2 Claims, 9 Drawing Figures

DATA COMMUNICATION WITH MODIFIED HUFFMAN CODING

This application is a division of application Ser. No. 711,325, filed Mar. 13, 1985, now U.S. Pat. No. 4,646,061.

FIELD OF THE INVENTION

The present invention relates generally to the transmission and reception of multiplexed encoded data which has been encoded for data compression or compaction, with the more frequently used characters in the particular data having shorter encoded lengths for transmission.

BACKGROUND OF THE INVENTION

It is known that Huffman coding may be used to improve the efficiency of transferring information over a communication link. In Huffman coding, the code length for each character or group of characters is based on the probability of occurrence of the characters represented by the code. A frequently-used character is assigned a short code, whereas an infrequently-used character is assigned a long code. If one data source is used, a Huffman code can be readily generated based upon the frequency of occurrence of each of the characters. For example, if English is the source, the letter "e" may be assigned a short code and the letter "z" a long code. Different data sources may require different Huffman codes. For example, Huffman code for normal English text may not be very efficient for Greek text or for FORTRAN data. Implementation complexity is thus increased in a multisource system if compression efficiency is maintained. Of even more importance in data communication, the source may in general fall within one of three basic types: (1) principally regular text, (2) principally numbers, or (3) principally text in capitals, each of which is likely to require a very different Huffman coding.

For a data communication application, Huffman coding may be used to reduce the number of bits required to send normal ASCII text data by substituting different unique codes for each character to be sent. By substituting short codes for those characters used frequently and longer codes for those characters used infrequently, a reduction in the total number of bits sent is achieved even though some characters may take as many as 20 bits. In order to enhance transmission efficiency, it is desirable, however, to create a different Huffman code for each type of incoming data. For example, a code set that will yield good efficiencies for sources of principally capital letters such as FORTRAN data sources, or one for sources which are principally numbers such as financial reports might each yield a gross inefficiency for normal text data which contains a mixture of upper and lower case letters and numbers. Thus, each of these types preferably would be encoded with their own distinct Huffman code. It is therefore desirable to be able to match the Huffman code to the source data so that good compression efficiency is maintained without regard to source type.

In addition, there are at least two more basic problems encountered in attempting to use Huffman coding in a microprocessor based multiplexed data communications link. The first is that many message source types may require 16 or more bits to encode seldom used characters with regular Huffman coding. If 8 bit microprocessor and memory are used to implement such a link, this could result in requiring at least triple precision memory to be used for storing the coded characters, using extra memory and processing time and might also require bus transfers of more than the standard 8 bits.

The second problem in using Huffman coding in a multiplexer is encountered at the receiving end of the multiplexed transmission link. Since the incoming characters are of variable length, the incoming bit stream must typically be decoded and examined bit by bit to determine where each character starts and ends. Frequently the data multiplexed at and sent from one port of the transmitter, and destined for a particular port (an individual low speed I/O in a multiplexed receiver, could be using a different Huffman encoding table from that used to multiplex data from another port in the transmitter, in order to obtain the maximum compression efficiency. Thus the decoding of the incoming bit stream using all the different encoding tables in parallel will impose an intolerable task on the aggregate logic which has the task of combining the multiple paths of low speed data into multiplexed high speed data. If the decoding were to be done in each low speed I/O port logic, at normal data transmission rates the number of transfers between the aggregate logic and the various low speed I/O port logic could very well exceed the capacity of the interconnecting bus.

The problems enumerated in the foregoing are not intended to be exhaustive, but rather are among many which tend to impair the effectiveness of multiplexed data transmission employing compression encoding wherein different kinds of data sources are multiplexed together.

It is therefore a general object of the present invention to provide an improved method and apparatus for the multiplexed transmission of data from various different types of data sources which are compaction or compression encoded for transmission. The terms compaction and compression are used interchangeably and considered synonymous for purposes of this document.

SUMMARY OF THE INVENTION

In accordance with the invention, the foregoing problems are solved by a unique data communication multiplexer using a "modified" Huffman encoder to which is fed codes of equal bit length from a plurality of port logic "frequency" encoders.

The frequency and modified Huffman encoders double encode input data before sending it as encoded data. The first encoding is done by the port logic on each individual data stream. This enables each port to use an encoding algorithm that is optimized for the type data going through that port. The significant improvement over plain Huffman coding is that the output of this first encoding is not the finished Huffman code, but is a function of the expected relative frequency of use of the original input character in the type of data stream being processd. This is referred to as the "frequency code."

In one embodiment, the frequency code can be limited to only 8 bits in length, so that 8 binary digits can represent a frequency table having 256 possible positions in order of relative frequency of use of each character. Or, 128 positions can be utilized with one bit reserved for parity. The frequency code can thus be transferred on the system bus by a single transfer, which is a significant advantage. As characters expressed in terms of position in the order of frequency table, i.e., the frequency code, are brought into the aggregate logic, the frequency codes are then converted to a Huffman-type code for the transmission to the remote end. The Huffman-type code will contain variable length characters with some possibly as short as 2 or 3 bits.

As this data is received at the remote end, the aggregate logic needs only to check against one code table to decode the data into the proper frequency code. The frequency code is then transferred to the appropriate port logic for conversion back to the desired data format. All that needs to be done is that the appropriate port use the same frequency code for the particular kind of data source as was used at the transmitter end.

Some significant advantages of the invention are: (1) it enables the encoding to be optimized for each port as a function of the type data being processed by that port; (2) it eases the storage required in the ports to change the code tables as the type of data being processed by a given port is changed; (3) it significantly reduces the processing being done by the aggregate logic; and (4) it enables the transfer rate on the receiver system bus to be minimized.

Examples of the more important features of the present invention have thus been given rather broadly in order that the detailed description thereof which follows may be better understood, and in order that the contribution to the art may be better appreciated. There are, of course, additional features of the invention which will be described hereinafter and which will also form the subject of the appended claims. These features and advantages of the present invention will become more apparent with reference to the following detailed description of a preferred embodiment thereof in connection with the accompanying drawings, wherein like reference numerals have been applied to like elements.

DETAILED DESCRIPTION OF THE PREFERRED EMBODIMENT

Figure 1:
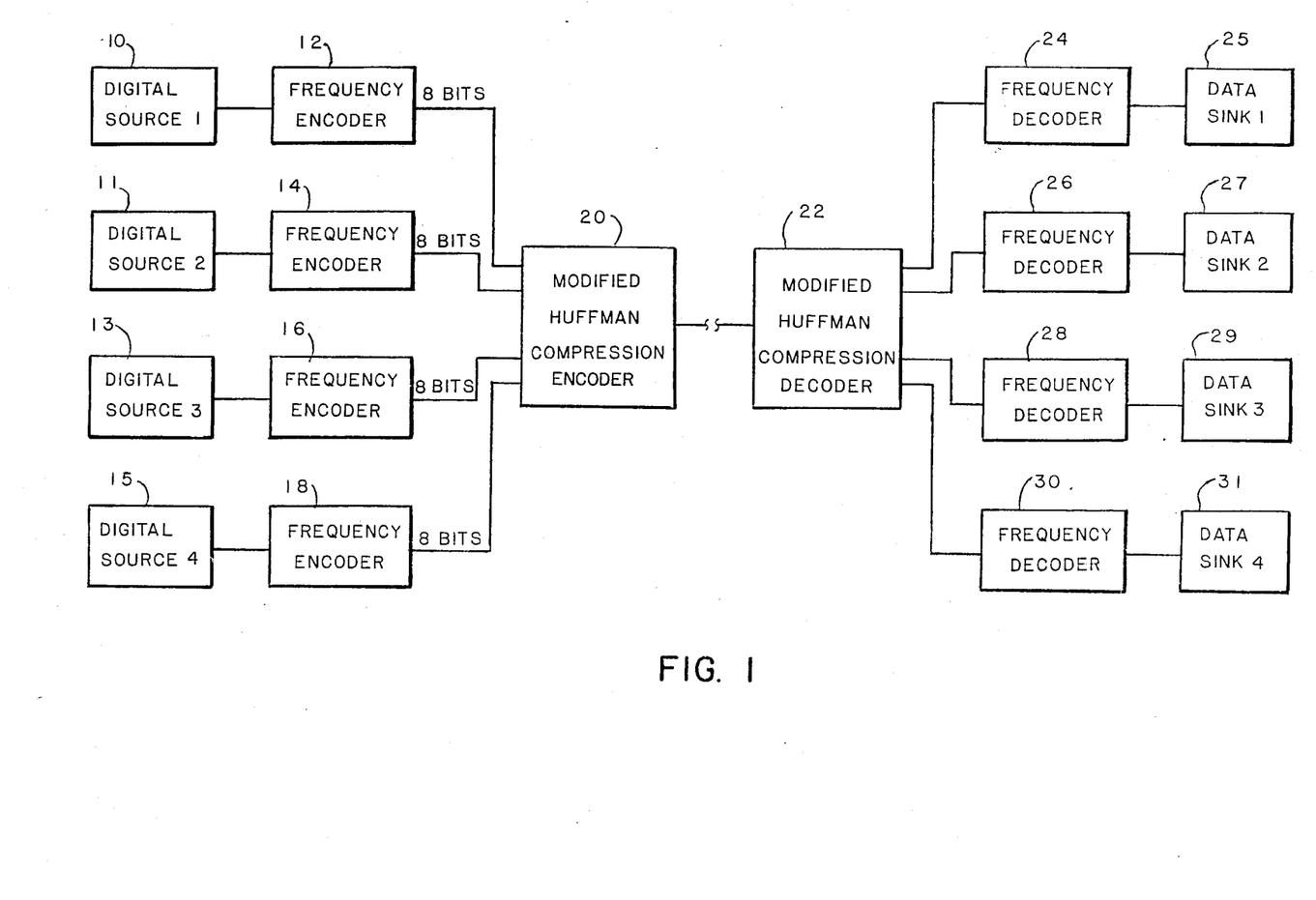
FIG. 1 illustrates a block diagram of the preferred embodiment of the invention.

FIG. 1 illustrates a system block diagram for implementing the present invention. The system includes a plurality of data sources 10, 11, 13 and 15 such as computers, terminals, etc., which produce character outputs in one of several forms such as FORTRAN, English, COBOL, decimal, etc. Each source feeds its digital output to a respective frequency encoder 12, 14, 16, 18. Each frequency encoder 12, 14, 16, 18 outputs a frequency code whose characteristics are determined by the particular type of source data currently being handled at that particular port. The output of each frequency encoder 12, 14, 16, 18, preferably limited to eight bits, is transferred to an aggregate encoder 20 denominated the modified Huffman compression encoder. The variable bit length output of the modified Huffman encoder 20 provides a modified Huffman coding of the frequency code which depends on the relative distribution and order of frequency represented by the frequency code. Those characters from the data source which, according to the frequency code, are occuring at higher rates in the data source, will be given a short Huffman code and those occuring at lower frequencies will be given correspondingly longer Huffman codes. The output of the modified Huffman encoder 20 forms the output of the multiplexer and may go to a modem (not shown) apparatus as known in the art for transmitting over a telephone channel or other communications medium. In the alternative, the compacted code may be transmitted over a radio frequency or fiber optic link or other such medium.

It will be recognized that the frequency encoders 12, 14, 16 and 18 and the modified Huffman encoder 20 may form a portion of a modem (as will be described later). It will also be recognized that the output of the modified Huffman encoder 20 is the same for the same frequency code output of any of the frequency encoders without regard for source. Thus, in one data source "e" may have a frequency code of 01 (hexadecimal, i.e., 00000001 binary) indicating it is a frequently used character in that source, and for another source "A" may have the same frequency code even though it represents a different character. The output of 20 is destined for a selected one of a plurality of ports at the receiver end and is a Huffman encoding or modified Huffman encoding depending only on the frequency code. The Huffman code would therefore be the same code for both the "e" and "A" coming from different sources in the above example due to having similar probabilities for use at their respective sources. At the receiving station in FIG. 1, a modified Huffman compression decoder 22 extracts the frequency code and, in conjunction with its multiplexing porting logic decodes the Huffman encoded frequency code and directs it to its respective port. Each port contains a frequency code decoder 24, 26, 28, and 30 whose characteristics are determined by the particular type of data currently being handled at that particular port. Each frequency decoder 24, 26, 28 and 30 supplies digital output data, in the language used by its corresponding sending source, to a data sink 25, 27, 29 and 31 connected to the port, which may be a computer, terminal, etc.

Figure 2:
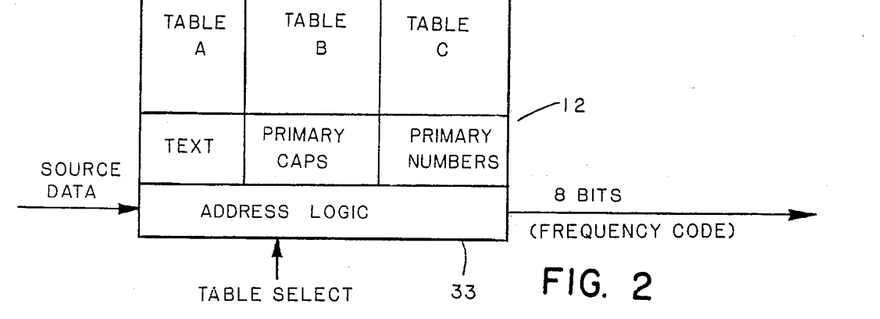
FIG. 2 illustrates in more detail a frequency encoder which may be used in the preferred embodiment of the invention.

A typical frequency encoder, for example 12, is illustrated in more detail in FIG. 2. This encoder 12 includes a plurality of table look-up memories 32, 34, 36, one for each type of data source desired to be accommodated. The selection of the particular table 32, 34, 36 could be by the operator, self adaptive, or under control of a corresponding digital data source so that if the source itself changes the type of data being sent, a different table memory 32, 34, 36 in the respective frequency encoder 12, 14, 16 or 18 can be selected. The frequency encoder 12, 14, 16 or 18 typically will be preloaded with tables such as 32, 34, 36 of order of frequency of use of each character used in each type of source data to be accommodated. The table gives the order of frequency of use of each character from most used to least used.

Although, as noted above, the preferred 8 bit format could represent 256 different positions on such a table, the data source may have more or fewer possible character types. The data from the respective source, for example 10, is loaded into the address logic 33 for the memory and according to which table 32, 34, 36 is selected, a frequency code corresponding to the input data character is the output of the frequency encoder.

Frequency coding for different respective data sources can be easily done in advance by analyzing a representative sample of the type of the data in question. By determining the number of occurrences of each respective character within the sample, an order of frequency list can easily be generated which ranks each character by relative order of occurrence. It is to be noted that in achieving benefit from the present invention it is not necessary for the frequency code table for a respective data source to perfectly match that data sample. It has been found that by sampling several thousand characters in a representative data stream, an entirely satisfactory frequency table can usually be generated. Further, even if by sampling 500,000 or 1,000,000 or more characters the table might be slightly modified and more perfect, the benefits of the present invention are not significantly detracted from by the lesser order of perfection from using a smaller sample of the data source.

Figure 3:
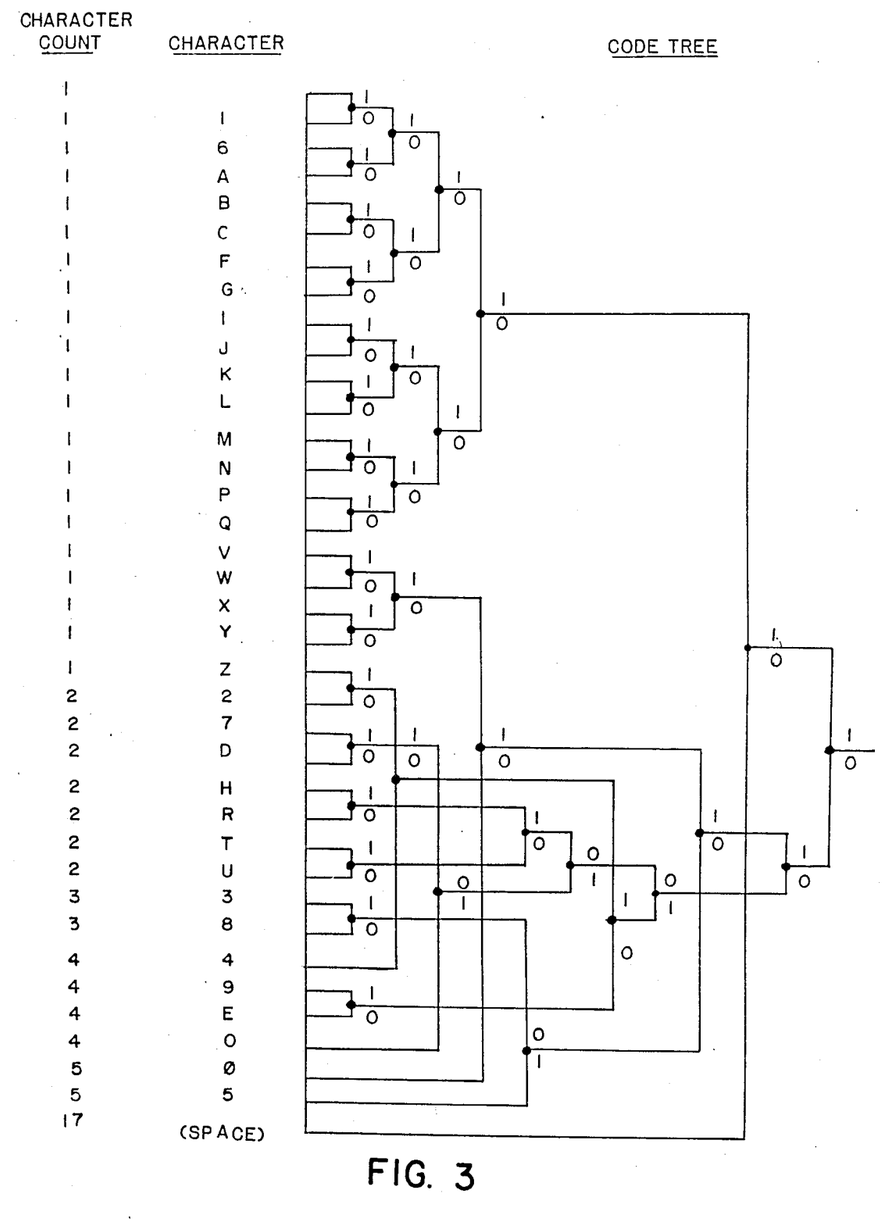
FIG. 3 shows an example code tree for a standard Huffman encoded character set.

It will be appreciated that many characters in Huffman coded format have the same number of bits assigned to them. For example, in a sample table having 37 character types there may only be four different bit lengths given to characters on the frequency code table. This can be seen for example by reference to FIG. 3 in conjunction with Table 1, which illustrates a frequency code and a conventional Huffman code generated by looking only at 84 characters in a data stream. The character set was limited to capital letters, numbers, spaces and periods. This encoding was generated by analyzing the message: "THE <space> QUICK <space> BROWN <space> FOX <space> JUMPED <space> OVER <space> THE <space> LAZY <space> DOG. 1<space> 22 <space> 333 <space> 4444 <space> 55555 <space> 6<space> 77<space> 888<space> 9999 <space> 00000". By frequency coding and then Huffman encoding according to the frequency code, the total number of bits needed to transmit these 84 characters in 8 bit hexadecimal was reduced according to this present invention by 41%. The Huffman code for this example was generated by the code tree of FIG. 3.

By way of example using Table I, assume that the message "EXAMPLE TEXT" is to be transmitted over the system of FIG. 1. First one of the frequency encoders translates each of the twelve characters in "EXAMPLE TEXT" into an 8 bit binary frequency code. The hexadecimal equivalent of this translation, with hyphens added for clarity, is:

"05-13-22-19-17-1A-05-01-B-05-13-0B"

which in 8 bit binary is:

"0000
0101-00010011-00100010-00011001-00010111-000-
11010-00000101-00000001-00001011-00000101-00-
10011-00001011"

This frequency code, each character of which is represented by an 8-bit binary word, is in turn translated by the Huffman encoder into the following compressed code for transmission:

"00100-011101-111100-110011-110001-110100-00100-
-10-000001-00100-011101-000001"

In each case, above hyphens are added for clarity and are not actually present in the respective codes. The reverse operation, of course, occurs at the receiving end. When encoding long strings of text, the savings achieved by such encoding process (especially with frequently used characters such as "space") considerable.

It should be noted that a number of characters in Table I have the same character count. Therefore, their arrangement in this table is somewhat arbitrary. This will generally happen even when a large text sample is analyzed and has no effect on the compression efficiency. It should also be noted that the Huffman code for this set of characters is not unique in that other Huffman codes could be generated which would have equal compression efficiency.

Another point of interest with respect to Table I is that several of the compressed characters appear to have a common decimal Huffman code equivalent. For example, ASCII characters 5, 9 and 7 are all represented by a binary 5. It is clear that the binary Huffman code for each is uniquely distinguished by its length and content. Decoding of these characters to uniquely distinguish characters having different length is accomplished by examining the coded message bit by bit, including leading zeros. For example, the first two bits are examined to determine if they are present as a coded character in the table. If not present, the next bit is added to form a three bit word and it is examined for presence in the table. If not present, the next bit is added to form a four bit word and it is examined for presence in the table. This process continues until a valid binary word is discovered.

TABLE I

| ASCII EQUIV | HEXA-DECIMAL FREQUENCY CODE | CHAR. COUNT- | HUFF-MAN CODE LENGTH | BINARY HUFF-MAN CODE |
|---|---|---|---|---|
| . | 25 | 1 | 6 | 111111 |
| i | 24 | 1 | 6 | 111110 |
| 6 | 23 | 1 | 6 | 111101 |
| A | 22 | 1 | 6 | 111100 |
| B | 21 | 1 | 6 | 111011 |
| C | 20 | 1 | 6 | 111010 |
| F | 1F | 1 | 6 | 111001 |
| G | 1E | 1 | 6 | 111000 |
| I | 1D | 1 | 6 | 110111 |
| J | 1C | 1 | 6 | 110110 |
| K | 1B | 1 | 6 | 110101 |
| L | 1A | 1 | 6 | 110100 |
| M | 19 | 1 | 6 | 110011 |
| N | 18 | 1 | 6 | 110010 |
| P | 17 | 1 | 6 | 110001 |
| Q | 16 | 1 | 6 | 110000 |
| V | 15 | 1 | 6 | 011111 |
| W | 14 | 1 | 6 | 011110 |
| X | 13 | 1 | 6 | 011101 |
| Y | 12 | 1 | 6 | 011100 |
| Z | 11 | 1 | 6 | 001111 |
| 2 | 10 | 2 | 6 | 001110 |
| 7 | 0F | 2 | 6 | 000101 |
| D | 0E | 2 | 6 | 000100 |
| H | 0D | 2 | 6 | 000011 |
| R | 0C | 2 | 6 | 000010 |
| T | 0B | 2 | 6 | 000001 |
| U | 0A | 2 | 6 | 000000 |
| 3 | 09 | 3 | 5 | 01001 |

TABLE I-continued

| ASCII EQUIV | HEXA-DECIMAL FREQUENCY CODE | CHAR. COUNT- | HUFF-MAN CODE LENGTH | BINARY HUFF-MAN CODE |
|---|---|---|---|---|
| 8 | 08 | 3 | 5 | 01000 |
| 4 | 07 | 4 | 5 | 00110 |
| 9 | 06 | 4 | 5 | 00101 |
| E | 05 | 4 | 5 | 00100 |
| O | 04 | 4 | 5 | 00011 |
| 0 | 03 | 5 | 4 | 0110 |
| 5 | 02 | 5 | 4 | 0101 |
| <Space> | 01 | 17 | 2 | 10 |

Thus it is possible with the present invention to make a very accurate frequency table for a generally used type of source data, employing a relatively very large sample, and it is also possible to achieve beneficial results from the present invention with relatively smaller samples of a data source. It will also be understood that techniques in microprocessor implementation presently exist to enable the ongoing sampling of a nonstandard data source or foreign language source for which the frequency encoder has no prestored table in memory, and by the above-noted analysis generate and load into an appropriate variable table memory a table, such as shown in Table I, suitable for use in the present invention. Current microprocessor programming techniques could also enable continuing sampling of such a nonstandard data source type so long as it is continuing to be empolyed, and to enable a periodic update of the variable nonstandard frequency code table. Of course, the generated and updated variable frequency code tables hust described must be sent to the receiver and loaded in appropriate memory for use in the receiver. In a similar manner, it may be advantageous to transmit a frequency table which is optimized for a specific message if the message is long enough so that the overhead of transmitting the table results in better efficiency than if the inefficiencies of an imperfect table are tolerated.

Figure 4:
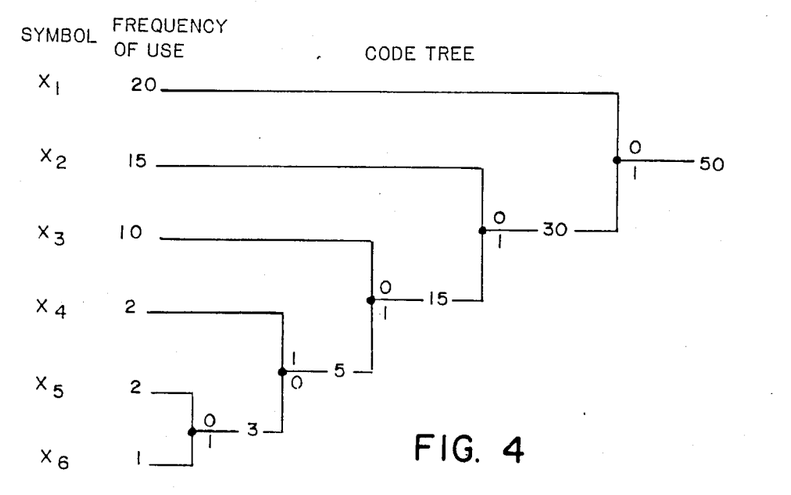
FIG. 4 shows the process for generating a standard Huffman code tree.

Turning now to FIG. 4 the standard Huffman encoding technique is described. This technique is well-known in the art and is described for example in Reference Data For Radio Engineers, 1975, by Howard Sams & Co., Indianapolis, Ind., pages 41-5 through 41-8. The standard Huffman encoding technique is more readily understood when described in conjunction with a smaller set of characters than that represented in FIG. 3. In FIG. 4 a set of six characters designated $X_1$ through $X_6$ are to be Huffman encoded. The relative frequency of use of these characters is shown as 20, 15, 10, 2, 2, and 1 respectively. In order to perform a standard Huffman encoding, the coding tree of FIG. 4 is generated by first, arranging these characters in order of their frequency of use. The two characters with the lowest frequency of use, that is $X_5$ and $X_6$, are then combined to form a set of characters who's combined frequency of use is the sum of their individual frequencies of use. This combined frequency is shown in the tree with numbers which interrupt the branches of the tree.

The character or character set with the higher frequency of use is assigned a binary value of 0 and the other character or character set is assigned a binary value of 1 at each branch in the tree. Next, the process is repeated by combining the two sets of characters which are least frequently used. In this example $X_4$ and the combination of $X_5$ and $X_6$ are combined for a combined frequency of use of 5. Once again the more frequently used character (or character set) is assigned a 0 at the branch while the less frequently used character (or character set) is assigned a 1. This process continues until there is only one path at the far right. The binary value of each symbol can at this point be read by tracing a path from right to left in the tree. For example, by tracing a path from the far right to the character $X_5$ its binary code of 11100 is determined. The code for each of the characters encoded according to the tree of FIG. 4 is shown in Table II. Also tabulated are the frequency of use and the length of each code word corresponding to each symbol.

TABLE II

| SYMBOL | FREQUENCY OF USE | HUFFMAN CODE | CODE WORD LENGTH |
|---|---|---|---|
| $X_1$ | 20 | 0 | 1 |
| $X_2$ | 15 | 10 | 2 |
| $X_3$ | 10 | 110 | 3 |
| $X_4$ | 2 | 1111 | 4 |
| $X_5$ | 2 | 11100 | 5 |
| $X_6$ | 1 | 11101 | 5 |

It should be noted by observing Table II that the binary code for $X_5$ and $X_6$ are each five bits long. By extrapolating to a larger system of characters, it is easy to see that the least frequently used characters in a particular character set may readily have extraordinarily long codes. operate with 8 or 16 bit words. The present invention alleviates this problem by creating a method of modified Huffman encoding resulting in code word lengths which may be restricted, within certain constraints, to more desirable lengths which may be handled more expeditiously, by for example, a microprocessor.

Figure 5:
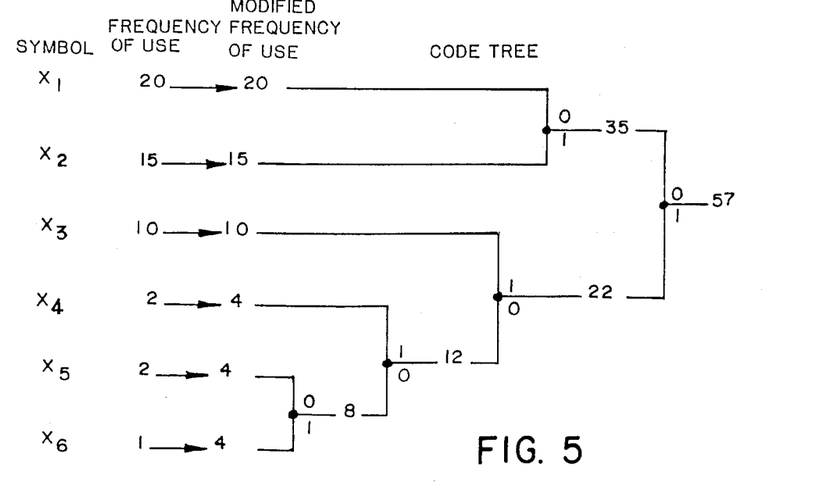
FIG. 5 shows the process for generating a modified Huffman code tree according to the present invention.

Turning now to FIG. 5 the same character set as shown in FIG. 4 having the same frequency as that shown in FIG. 4 is encoded according to the modified Huffman encoding scheme of the present invention. For this example, assume it is desirable that no code word exceed four binary digits in length. In order to accomplish this, the frequency table is artificially modified by increasing the frequency of use of one or more of the least frequently used characters. Specifically, in this example $X_6$ has been artificially been designated as being used four times instead of one. $X_5$ has been increased in frequency from two to four and $X_4$ has been increased in frequency from two to four. Of course, it will become apparent to those skilled in the art that other modifications are possible which would result in slightly different yet still usable modified Huffman encodings without departing from the spirit of the present invention. It should also be noted that the actual order of the characters does not need to be modified. It should be noted, however, that characters $X_4$, $X_5$ and $X_6$ could now be changedin order without affecting compression efficiency.

By following the exact same procedure outlined in the discussion of FIG. 4, with the exception of utilizing the modified frequency numbers, the code tree of FIG. 5 is created. The results of the modified Huffman encoding of FIG. 5 are tabulated in Table III.

TABLE III

| SYMBOL | FREQUENCY OF USE | MODIFIED FREQUENCY OF USE | MODIFIED HUFFMAN CODE | CODE WORD LENGTH | CHANGE IN CODE WORD LENGTH |
|---|---|---|---|---|---|
| $X_1$ | 20 | 20 | 00 | 2 | +1 |
| $X_2$ | 15 | 15 | 01 | 2 | 0 |
| $X_3$ | 10 | 10 | 11 | 2 | −1 |
| $X_4$ | 2 | 4 | 101 | 3 | −1 |
| $X_5$ | 2 | 4 | 1000 | 4 | −1 |
| $X_6$ | 1 | 4 | 1001 | 4 | −1 |

From Table III it is evident that the longest binary word in the modified Huffman code is the desired four binary digits long as compared with five binary digits resulting from standard Huffman encoding. It will also be noted that the present modified Huffman encoding is likely to be slightly less efficient than standard Huffman encoding as a result of having one additional binary digit present in the most frequently transmitted symbol $X_1$. However, it is also interesting to note that symbols $X_3$ through $X_6$ are each one less binary digit long than the standard Huffman encoded symbols.

In order to generate the modified Huffman code, the frequency of occurrence of symbols is artificially modified. A number of approaches may be taken to modification of the frequency information. Since a computer may readily be programmed to generate the code tree, the relative frequency may be systematically modified by increasing the frequency of the least frequently used symbols and then generating the Huffman code to test for the longest coded character. This process can be repeated until a desired maximum number of binary digits is achieved. Preferably, the frequency of the least frequently used character is modified only to the level of the next least frequently used character. From then on both characters' frequency of use is increased by one until the three least frequently used characters are equal. This process continues until the desired reduction in the maximum code length occurs. By proceeding in this manner, no actual changes in the order of the characters occurs.

A number of other schemes may also be utlized to effect changes in the frequency of use. For example, by visualizing the straight Huffman coding tree, the number of digits in the maximum length word may be determined by counting the number of nodes where branching takes place. Any alteration in the frequency which would cause a net reduction in the number of nodes in the path to the least frequently used symbols, while preferably not altering the order of the characters, will also result in a reduction in the length of the code which represents those symbols. It will also be evident that any number of possible modified Huffman codes may be generated for a given set of symbols. That is, for a given set of symbols there is not necessarily only one modified Huffman code having a predetermined maximum number of bits per word. For example, in FIG. 5, at the branch closest to $X_5$ and $X_6$ the assignment of 1 and 0 can be reversed without adverse effect.

It will also be evident to those skilled in the art that the relative frequency list may be generated by decreasing the usage of the most frequently used symbols but this may result in a less efficient Huffman coding. Other variations may also occur to those skilled in the art.

Figure 6:
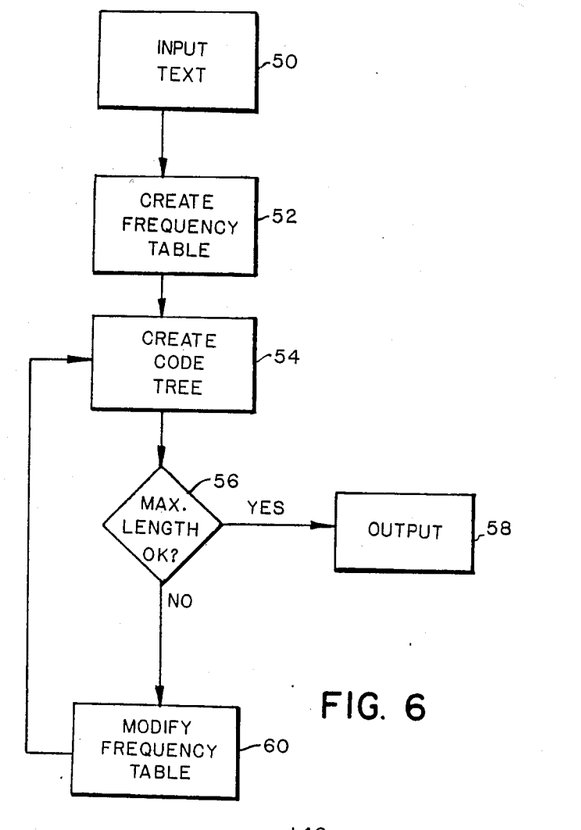
FIG. 6 is a flow chart of the modified Huffman encoding process.

One technique for modifying the frequency of use is to use a process according to the flow chart of FIG. 6. A sample of text to be analyzed is entered at step 50. This text is analyzed and sorted for frequency of use of each character at step 52 and a frequency of use table is generated. A code tree is generated at step 54 using a Huffman encoding or similar compression process. At step 56 the maximum word length is checked. If it is acceptably short, the process ends at step 58 which creates an output table of compressed characters. If the maximum code word length is unacceptably long in step 56, the frequency table is altered at step 60. Preferably this is done by increasing the frequency of use of the least frequently used character(s). Preferably, this is done in a manner which does not change the actual order of characters (from least to most frequently used) in the table. If necessary to preserve the order of the table, more than one frequency of use may be modified. After the table is modified, control is returned to step 54 where a new code tree is generated for analysis of maximum word length in step 56.

Alternative techniques for modifying the Huffman code may also be used by examining the code tree to analyze what frequencies of use should be modified and by how much in order to effect a reduced number of branchings in the path of least frequently used characters. Other techniques will also occur to those skilled in the art.

The frequency encoder of FIG. 1 thus compares the hexadecimal character representation in the source data source with the selected frequency table, which may as noted be an internally generated frequency table, or a table prestored in memory such as tables 32, 34, 36, which as shown are for data which is principally (1) text, (2) caps or (3) numbers respectively. The output of the respective frequency encoder is supplied to the Huffman encoder 20 and represents the position of that character on the selected relative frequency table 32, 34, 36. Huffman encoding or modified Huffman encoding is then done in the Huffman encoder 20 based only on the relative order of frequency as expressed in the frequency code. The reason this is referred to as modified Huffman encoding is due to the fact that pure Huffman encoding actually looks at the actual number of occurrences of a character in a sample used to generate the Huffman encoding and not simply the relative order of occurrence as when encoding a frequency code according to the present invention.

Figure 7:
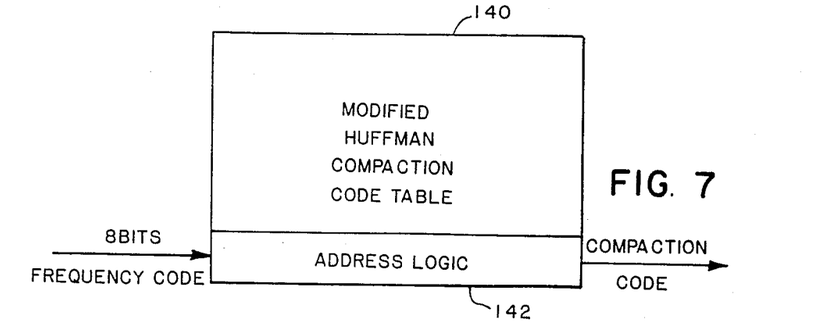
FIG. 7 illustrates in more detail the modified Huffman encoder according to the preferred embodiment of the invention.

Turning now to FIG. 7, the modified Huffman encoder 20 contains a Table 140 in which is stored a Huffman encoding of each possible position on the relative order of frequency of occurrence table, i.e., the frequency code. Thus, in the example noted above, the frequency code transferred to the modified Huffman encoder 20 from one frequency encoder 12 using one data source, and from another frequency encoder 14, using a different data source 11, would be the same for a given character in that data source if the same table such as table 32 is used in both encoders. The modified Huffman encoder would assign the same Huffman code to each of these. It does not need to know what the data source is or what characters occupy what positions on the respective relative order of frequency table for that data source. When the frequency code is loaded into an address logic 142 in the modified Huffman encoder 20, as shown in FIG. 7, that frequency code is used to address a memory location in the modified Huffman encoder 20 in which is stored the Huffman encode of the frequency code in the address logic 142. This Huffman code is what is transmitted to the receiver end.

As before noted, each frequency encoder 12, 14, 16, 18 provides its 8-bit output representing the relative order of frequency of occurrence of each individual input character to the modified Huffman encoder 20. The ability to limit the bus transfer capability from the frequency encoders 12, 14, 16 and 18 to the modified Huffman encoder 20 to 8 bits, at least for most data sources, i.e., those with under 256 characters, is very important in simlifying the needed processing capability of the microprocessor or other circuitry used in the encoder., The modified Huffman encoder 20 operates at a rate which is the sum of the character rates of each of the data sources 10, 11, 13 and 15 (in the example of FIG. 1) and provides an output which interleaves in some fashion the Huffman encoded characters representative of the parallel outputs from the frequency encoders 12, 14, 16, 18. Synchronization of the operation and interleaving may be accomplished according to well-known multiplexing techniques.

The output from the modified Huffman encoder 20 is ideally a character of from 1 to 15 bits in length to accommodate storage in a 16 bit memory. An important asset obtained by the modified Huffman code is the restriction in bit length to 15 bits or less, which provides considerable hardware advantages, although at some loss of compression efficiency. Of course, the principles of the present invention could also be employed with suitable processor capability where the mix of characters from one or more data sources is such that proper Huffman encoding of the resulting possible frequency codes exceeds 16 bits in length. However, since the bus transfers between the frequency encoders 12, 14, 16, 18 and the modified Huffman encoder 20 at the transmitter end and between the modified Huffman decoder 22 and the frequency decoders 24, 26, 28, 30 at the receiver end can always be limited to 8 bits, so long as there are less than 256 unique character types, a significant advantage is achieved by the present invention, even if the number of characters necessitates that some frequency codes be Huffman encoded into more than 16 bits for transmission.

It will be appreciated that in constructing a multiplexed data transmission transmitter or receiver, according to the present invention, certain significant advantages are obtained. Since the multiplexer at the transmitter end does not have to deal with Huffman codes of greater than 15 bits prior to transmission, but rather multiplexes 8-bit frequency codes into the modified Huffman type compression encoder, the processing requirements are simplified. Further, an even greater processing simplification is attained at the receiver end. This is because a single Huffman type compression decoder is used no matter what data source is employed in the respective one of a plurality of data sources multiplexed at the transmitter. Of significant advantage in the present invention is that there is a need only to compression encode and decode a single frequency of occurrence table universally applicable to many data sources and data sinks. This results, in the usual case, in there being a need for bus transfers at the transmitter and receiver ends of only the 8-bit frequency code once per character.

In lieu of manual selection of an appropriate frequency table, it is also possible to select the table by first assuming that all data received is of a particular type, for example ordinary text. Frequency codes can then be generated on that basis for a period of time. The output of the frequency encoder or even the compression encoder can then be analyzed for compression efficiency. If it appears that an incorrect selection of frequency encoding tables has been made, then a new selection can be made. That is, frequency encoding can be altered dynamically if it appears desirable to switch in order to attain good compression.

A parallel operation is also possible wherein, incoming data is simultaneously encoded according to each frequency table. The encoder then selects the table which is producing the most efficient data compression. One skilled in the art will readily recognize ways to implement such embodiments in light of the previous descriptions.

Figure 8:
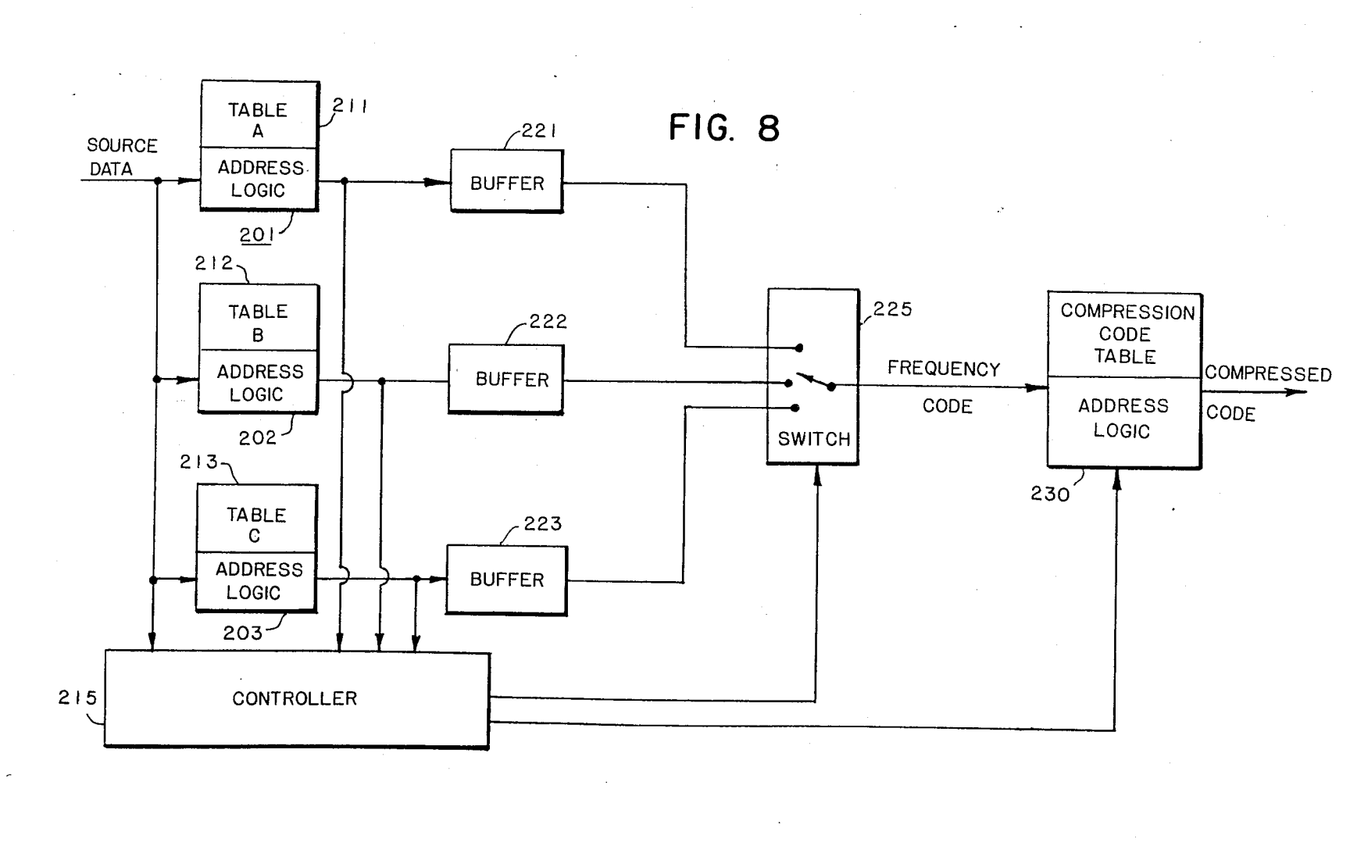
FIG. 8 shows a dynamically adaptive arrangement for implementing the present invention.

A system which operates in this manner is illustrated in FIG. 8. In this embodiment source data is applied to each of frequency encoders 201, 202, and 203. Each of these frequency encoders respectively use a frequency of use table 211, 212, and 213. Each table is optimized for a different type of data (for example A=primarily normal text, B=primarily caps, and C=primarily numbers). The output of each of the frequency encoders 201, 202, and 203 is also applied to controller 215.

The outputs of each of the frequency encoders 201, 202, and 203 are also coupled to buffers 221, 222, 223 respectively. The outputs of these buffers are applied to a switch 225 which is controlled by controller 215. The switch is utilized to select the output of one of the three buffers 221, 222, or 223 to provide frequency code to a compression encoder 230.

This system may operate in any of several different ways according to the characteristics of the controller as previously described. In one example, the source data is applied to each of the frequency encoders 201, 202, and 203 which each simultaneously produces frequency coded data to both their respective buffers and to the controller. The controller analyzes the frequency codes to determine which frequency code results in the best compression efficiency. This may be done in several different ways. For example, each of the three frequency codes may be compared with one another to determine which contains characters which are most frequently used. Or, the frequency coded data may be compared with the source data to determine compression efficiency. In another alternative, controller 215 may actually analyze the source data alone to determine which of the frequency encoders 201, 202, or 203 are best suited to encode the source data.

In any event, the controller determines which frequency encoder yields the best compression efficiency and selects the appropriate switch setting of switch 225 to transfer data from that frequency encoder to the compression encoder 230. Depending upon the size of the buffer and the particular source data being sent, it is possible that the controller could make an error or it is possible that different sections of data may be better encoded by one frequency encoder than another. In any event, controller 215 may determine at some point in time that a different frequency encoding may be more appropriate. At that time it may instruct the switch to change to a different frequency encoder and may also supply the compression encoder with an appropriate signal to insert in the compressed code which will allow the receiver to determine that a change has been made. The receiver side then selects the appropriate frequency table in order to properly decode the data being sent.

In some instances it may also be desirable for controller 215 to simply make a selection of frequency encoders 201, 202, and 203 at switch 225 based on statistical probability of the type of source data being sent. This decision can later be modified as previously described if it proves erroneous. Numerous other possible implementations will occur to those skilled in the art.

Figure 9:
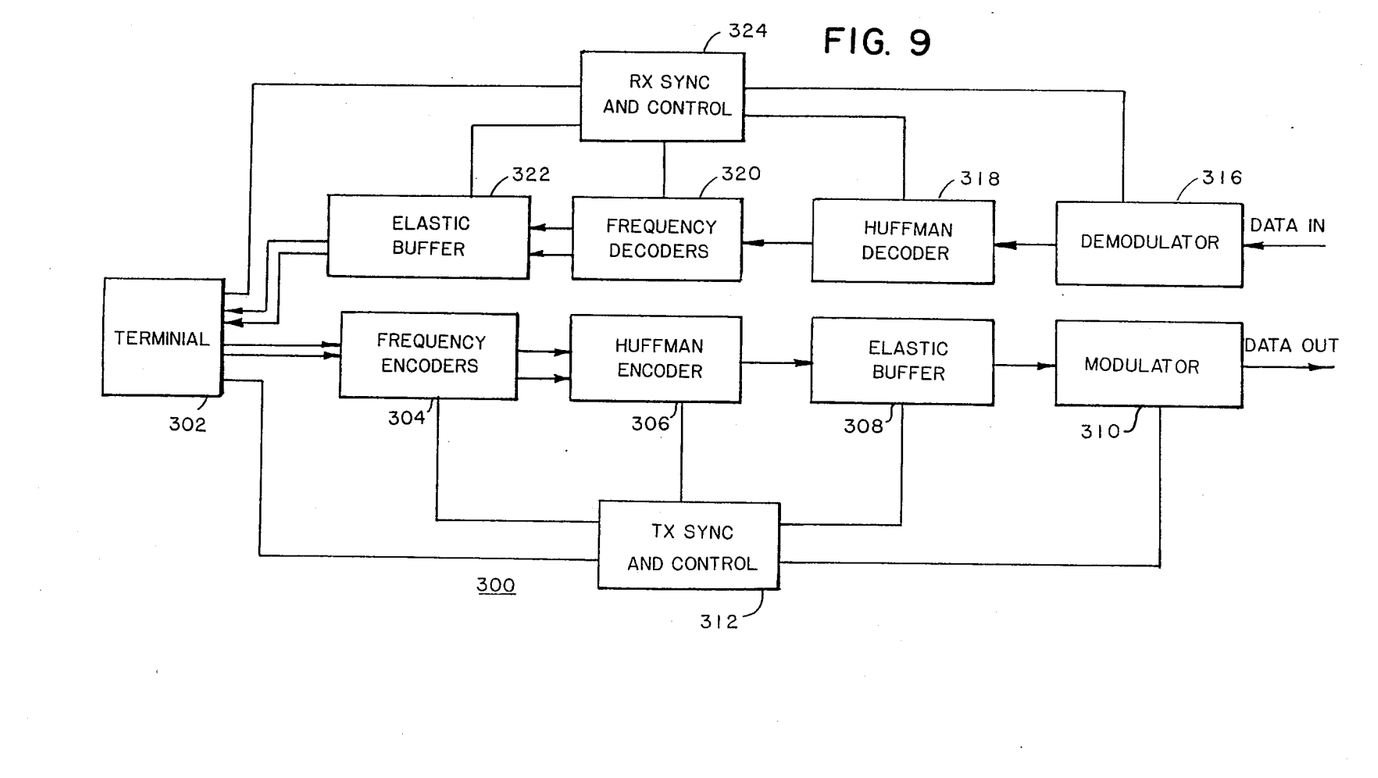
FIG. 9 shows a data compressing modem according to the present invention.

Turing now to FIG. 9, a data compressing modem 300 is shown connected to a high speed data terminal 302. Where it is desirable to couple high speed data terminals to for example 9600 bps telephone lines, the present invention may be utilized. In such an instance, if a 40% reduction in bits can be achieved by such an encoder, the high speed terminal can operate efficiently at approximately 16 kbps over a 9600 bps telephone line. Even where such improvements are not possible, satisfactory results may be achieved at significantly reduced cost when compared with leasing higher speed data lines and/or employing exotic echo canceling techniques to permit higher speed data to utilize telephone line transmission.

Terminal 302 is coupled to a frequency encoder 304 which is similar in construction to the frequency encoder of FIG. 2. Terminal 302 is coupled to frequency encoder 304 using either a serial or a parallel interface. Frequency encoder 304 generates a frequency code which is translated by Huffman coder 306 into a compressed code. This compressed code is applied to an elastic buffer 308. Elastic buffer 308's output is applied to a modulator 310 as is known in the art. Modulator 310 modulates the compressed code for transmission over telephone lines or other suitable media.

The operation of this system is controlled by a transmit synchronization and control circuit 312 which monitors the output of the Huffman encoder by inspecting the elastic buffer 308. Transmitter synchronization and control circuit 312 may include a phase lock-loop which applies a clock signal back to terminal 302 such that the frequency of data applied to frequency encoder 304 varies in accordance to how full the elastic buffer 308 is. A phase locked-loop is preferably utilized so that abrupt changes in clock frequency to terminal 302 will not occur. In this manner, as the elastic buffer fills up, transmitter synchronization and control circuit 312 instructs the terminal to slow down transmission of data. This would occur in the event that the data rate from the terminal 302 and the compression efficiency in the Huffman encoder is such that the data output of the Huffman encoder 306 is faster than the data rate in the modulator 310.

Conversely if the Huffman encoder is achieving very high efficiency, synchronization and control circuit 312 allows the terminal to speed up the rate it applies data to frequency encoder 304.

Incoming data to the modem is applied first to demodulator 316 which demodulates the data and applies it to Huffman decoder 318. Huffman decoder 318 converts the incoming data to a frequency code and applies it to frequency decoder 320 to be converted to an appropriate data format for receipt by terminal 302. This data is again applied to an elastic buffer 322 prior to being transmitted to terminal 302.

Receiver control and synchronization is maintained by a receiver synchronization and control circuit 324 which coordinates the operation of all receiver components. Receiver synchronization and control circuit operates to assure that decoded data is transmitted to terminal 302 received over the telephone lines. Thus, the present invention may also be utilized to effect high speed data transmission from a relatively high speed terminal over a somewhat slower transmission medium.

The foregoing description of the invention has been directed to particular embodiments in accordance with the requirements of the Patent Statutes and for purposes of explanation and illustration. It will be apparent, however, to those skilled in this art, that many modifications and changes in both the apparatus and method of the present invention may be made without departing from the scope and spirit of the invention. For example, there may be other forms of compression encoding than Huffman encoding such as Shannon-Fano encoding which could be employed with the present invention. In addition, between the compression encoding at the transmitter and compression decoding at the receiver, other encoding well known in the art such as encryption encoding may be employed, if desired.

Also, the present invention has been described in conjunction with a multiplexed data transmission system wherein the multiplexing is software implemented as is known in the art, and is described to be software implemented by use of available processing time and memory within the same microprocessor doing the multiplexing. The programming of a microprocessor to perform the functions of the present invention as described herein is well within the skill of the art using the teaching of the present invention. It will be understood, however, as is well known in the art, that without employing a microprocessor or other programmable data processor per se, the advantages of the present invention can be obtained by using circuit components such as read-only memories, random access memories and hard wired logic, programmed logic arrays, etc. which may be contained on integrated circuit chips. The circuits can easily be assembled to accomplish the frequency encoding and corresponding compression encoding according to the teachings of the present invention. It will also be understood that even the "stored memory" tables described in relation to the present invention could be implemented by hard wired logic circuitry to achieve most of the advantages of the present invention. Hard wired systems may be less flexible in that the more frequency code tables for different types of data sources that are needed, the more complex would be the hard wired logic circuitry which would be required. However, many of the features of the present invention could still be obtained with hard wired logic as opposed to a microprocessor or microcomputer implementation. It will further be apparent that the present invention may also be utilized with other suitable modifications which will be apparent to those skilled in the art. It is the applicant's intention in the following claims to cover all such equivalent modifications and variations as fall within the true spirit and scope of the invention.

What is claimed is:

1. A method of encoding data characters, comprising the steps of:

sorting said data characters according to approximate frequency of occurrence to produce a first frequency table;

artificially altering the frequency of occurrence of one of the least frequently used data characters, thereby creating a modified frequency table; and Huffman encoding said data according to said modified frequency table to produce a modified Huffman encoding of said data characters.

2. The method of claim 1, wherein said Huffman encoding step includes the step of encoding each of said characters with a code word having a predetermined maximum word length.

* * * * *